United States Patent [19]

Shimbo

[11] 4,449,284

[45] May 22, 1984

[54] METHOD OF MANUFACTURING AN INTEGRATED CIRCUIT DEVICE HAVING VERTICAL FIELD EFFECT TRANSISTORS

[75] Inventor: Masafumi Shimbo, Tokyo, Japan

[73] Assignee: Seiko Instruments & Electronics Ltd., Tokyo, Japan

[21] Appl. No.: 183,064

[22] Filed: Sep. 2, 1980

[30] Foreign Application Priority Data

Aug. 30, 1979 [JP] Japan .................................. 54-110891
Aug. 30, 1979 [JP] Japan .................................. 54-110892

[51] Int. Cl.³ .......................................... H01L 21/95
[52] U.S. Cl. .................................. 29/571; 29/576 W; 29/577 C; 29/578; 29/580; 357/43; 357/55; 148/187
[58] Field of Search ...................... 357/20, 22, 43, 55; 148/187; 29/571, 576 W, 578, 580, 577 C

[56] References Cited

U.S. PATENT DOCUMENTS 4,008,107 2/1977 Hayasaka et al. ................. 29/578 X
4,284,999 8/1981 Iwanami ........................... 357/55 X Primary Examiner—G. Ozaki
Assistant Examiner—Alan E. Schiavelli
Attorney, Agent, or Firm—Robert E. Burns; Emmanuel J. Lobato; Bruce L. Adams

[57] ABSTRACT

A method of manufacturing an integrated circuit device including vertical static induction transistors (SIT) having a first recess between the gate region and the drain (or source) region to reduce the capacitance between both regions and a second recess on an outer surface of the SIT gate to reduce the gate capacitance and a minority carrier storage. The method includes the steps of removing a masking film on the SIT channel region while leaving the masking film at the portions of the gate region and the drain region; forming the first and the second recesses in the channel region; locally oxidizing the exposed channel region; and forming the gate region and the drain region by removing the masking film.

6 Claims, 44 Drawing Figures

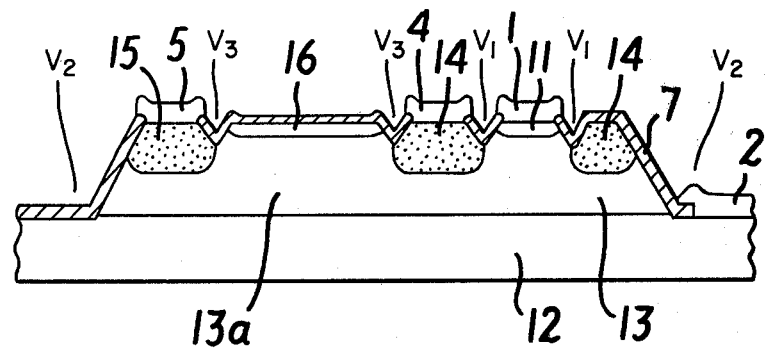
FIG. 5
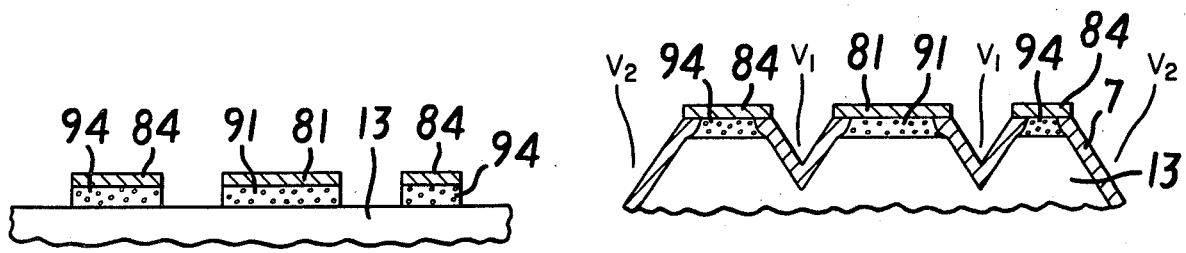
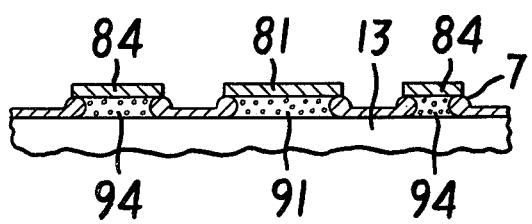
FIG. 6a
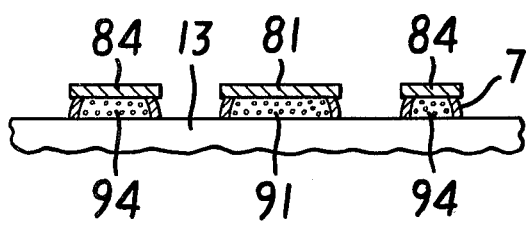
FIG. 6b
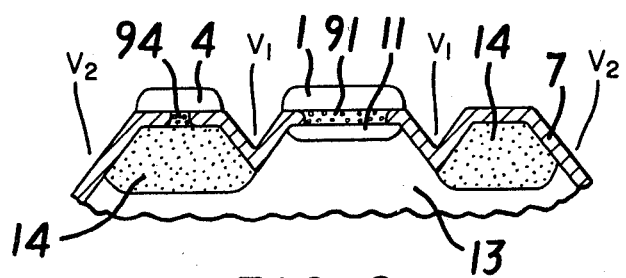
FIG. 6c
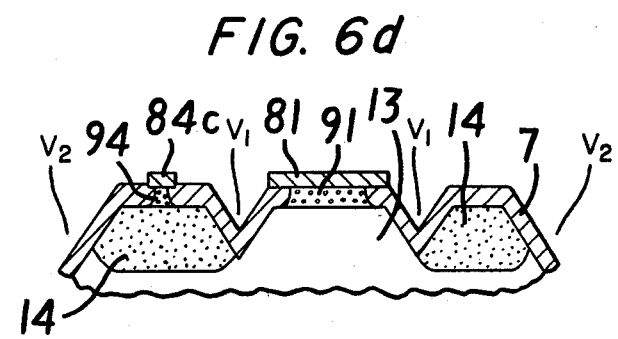
FIG. 6d
FIG. 6e
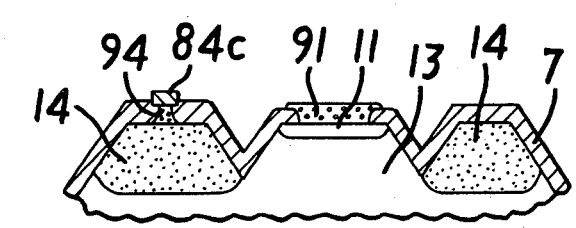
FIG. 6f
FIG. 6g

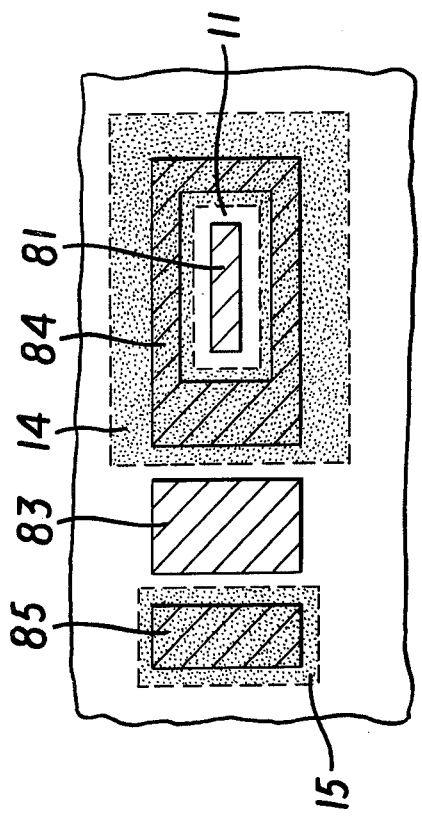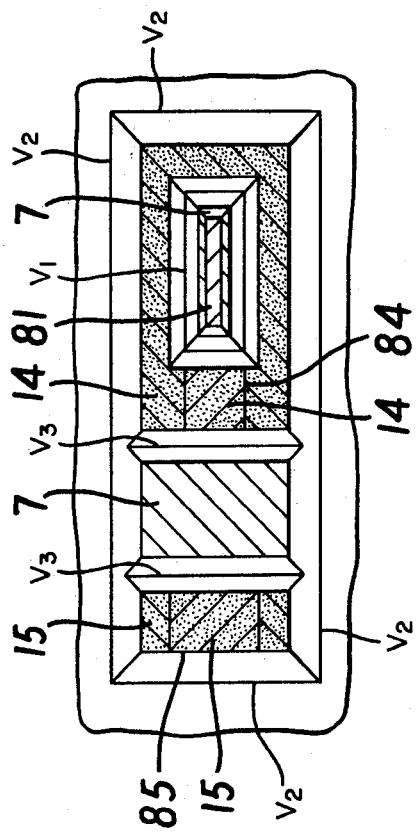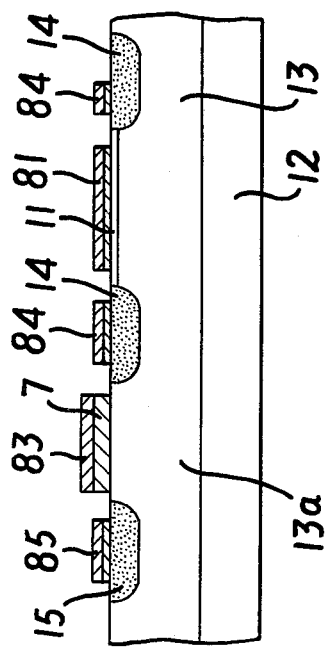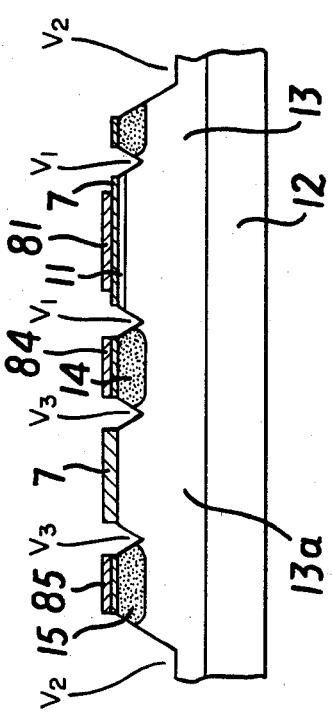
FIG. 7f
FIG. 7h
FIG. 7e
FIG. 7g

METHOD OF MANUFACTURING AN INTEGRATED CIRCUIT DEVICE HAVING VERTICAL FIELD EFFECT TRANSISTORS

BACKGROUND OF THE INVENTION

The present invention relates to an improved structure and method of manufacturing of an integrated circuit device including a field effect transistor such as a vertical type static induction transistor (SIT) or a FET.

An SIT has excellent high frequency response characteristics due to a high input impedance, a low output impedance, a low capacitance and a high conversion conductance, and it is well known that an integrated circuit in which it is incorporated has advantages of a high speed operation and a lower power consumption. A vertical structure type SIT has further advantages of high integration density and ease of fabrication. However, there are some problems to be solved with respect to device structure and method of fabrication in order to further improve the characteristics of the device.

In an I²L type SITL composed of a planar-gate type SIT and a lateral bipolar transistor, a drain electrode and a gate electrode are conventionally formed almost on the same surface. This planar-gate type SITL can be fabricated by simple steps. However, since the SITL requires the characteristic of a normally off type device, the cross-sectional area of the channel region must be formed small.

Since the high impurity concentration region of the main electrode and the high impurity concentration region acting as a gate are overlapped, the capacitance between them is increased and satisfactory characteristics of the SITL cannot be obtained. In this SITL structure, it is difficult to reduce the minority carrier storage.

As a result, improvement in operational speed and power consumption can not be achieved. To avoid these problems, a step cut type SITL in which the gate is formed on the bottom surface or the side face of the step has been proposed. However, this type of SITL is not always sufficient due to the difficulty of wiring the electrode regions and the fine working required for forming the bottom surface. The problems described above will not occur only in the case of an inverted SIT in an I²L type SITL, but also in the case of a so-called vertical-type SIT in which the n+ source electrode is formed on the major surface, in a P channel SIT, in a normally-on type SIT, and in other types of SIT logic circuits and analog circuit.

Furthermore, problems with the prior art will be hereinafter described by referring to FIG. 1.

FIG. 1 shows the typical example of a conventional planar-gate type SITL of one unit, wherein a planar view thereof (FIG. 1b), a sectional view thereof taken on line A—A' (FIG. 1a) and a sectional view thereof taken on line B—B' (FIG. 1c) are illustrated. The n-channel SIT is composed of a n+ source region 12 and a n+ drain region 11 on the side of a n+ substrate which is a main electrode high impurity density region, a p+ gate region 14 for a control electrode and a n− channel region 13, and the lateral BJT is composed of a p+ emitter region 15, a n− base region 13a and a p+ collector region 14. The p+ collector region and the p+ gate region 14 are a common region, and the n+ base region and the n+ source region 12 are a common region. In the plan view of FIG. 1b, to simplify, a surface oxide film 7 and metal wirings (an emitter electrode 5, the gate electrode 4 and the drain electrode 1) are omitted therefrom. A voltage of a power source is applied to the emitter electrode 5, an input voltage is applied to the gate electrode 4 and an output voltage is derived from the drain electrode 1.

The planar-gate type SITL can be fabricated by a simple series of steps comprising four steps of photolithography and two steps of diffusion. However, there is still the following problem. Since this SITL requires the characteristic of a normally off type SIT, a gate-spacing $W_G$ should be less than two times the width of a depletion layer determined in accordance with a diffusion potential and $W_G$ is less than 20 to 2 [μm] when an impurity density of the n− channel region 13 is between $10^{13}$ and $10^{15}$ [cm$^{-3}$]. In order to determine a source-drain leakage current at a desired small value when a gate voltage is zero, it is preferable to reduce the dimension $W_G$ and to keep a potential barrier for electrons injected from the n+ source region 12 away from the n+ drain region 11. Furthermore, to reduce a source negative feed-back resistance, this potential barrier preferably is taken close to the n+ source region 12 so that the p+ gate region should be formed so as to be deep to the same degree. This causes the increase of plane area of p+ gate region 14, and the p+ gate region 14 and the n+ drain region 11 come to overlap each other as shown in FIG. 1 resulting in an increase in the gate-source capacitance and gate-drain capacitance.

In order to reduce the gate-drain capacitance, a fine working technique to attain accurate positioning is required for forming a n+ diffusion opening with sufficiently small diameter and it is not allowed to form the deeper diffusion region. As a result, a spike phenomenon for electrode metal is liable to occur, and yield is reduced. Moreover, the outer peripheral region of the p+ gate region 14 is not at all necessary for the operation thereof and holes are injected into the n− region 13 from the p+ gate region 14 with an increase of the junction capacitance so that a carrier storage effect becomes more effective.

SUMMARY OF THE INVENTION

The present invention provides structure which can overcome drawbacks of the conventional SIT, and a method for easily producing the structure.

An object of the present invention is to reduce the capacitance by forming a first concave portion between a gate high impurity density region appearing on a major surface and a main electrode high impurity density region, such as a drain or source and then in order to avoid the high impurity density regions overlapping each other.

A second object of the invention is to reduce effects caused by an outer surface of an inoperative portion in the gate region by the formation of a second concave portion and then to reduce a junction area and a minority carrier storage effect.

A further object is to lessen the spreading of gate area due to a lateral diffusion by the first concave portion and the second concave portion even if the gate region is deepend.

Another object of the present invention is to provide a manufacturing method in which fine working and metal wiring can be easily performed because of a planar-gate type, wherein a surface side main electrode region and a gate region appear on the same surface.

Another object is to provide an easy and exact producing method, wherein width and position of the gate region and the surface side main electrode region is determined by one masking step and a selective oxidation technique using an insulation film comprising a nitride, such as $Si_3N_4$ film, $SiO_xN_y$ film or the like is used. The effect is remarkably increased if an anisotropic etching technique or a polycrystal film is employed.

Moreover, it is an another object of this invention to provide the use of a fabrication technique which deposits a high impurity concentration polycrystal layer on the low impurity concentration mono-crystal of silicon changed into a channel region, the utilization of easy oxidation and diffusion of the polycrystal, and the ease of forming contact openings using an insulating film.

As a result, the integrated circuit including a SIT which operates with high speed and low power consumption is realized by the manufacturing method which is easy and reliable.

BRIEF DESCRIPTION OF THE DRAWINGS

FIG. 1b is a plan view, and FIGS. 1a and 1c are sectional views taken on lines A—A' and B—B', respectively.

FIG. 2b is a plan view and FIGS. 2a and 2c are sectional views taken on lines A—A' and B—B', respectively.

FIG. 5 is a sectional view of the structure formed by the method of the present invention illustrated in FIG. 4.

FIGS. 6a to 6g are sectional views illustrating another method according to the present invention.

FIGS. 7a to 7j are plan views and sectional views illustrating the method of the present invention.

FIGS. 9a to 9e are enlarged partial sectional view illustrating another method of the present invention.

DESCRIPTION OF THE PREFERRED EMBODIMENTS

The present invention will be described in detail in conjunction with the accompanying drawings.

Figure 1A:
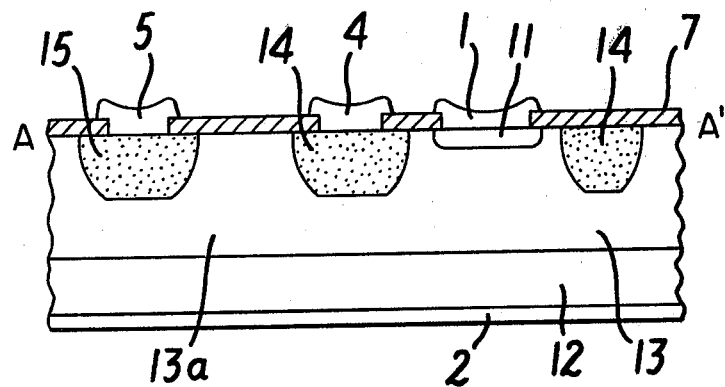
FIGS. 1a to 1c illustrate an example of the SITL structure of the conventional planar-gate type.
Figure 1B:
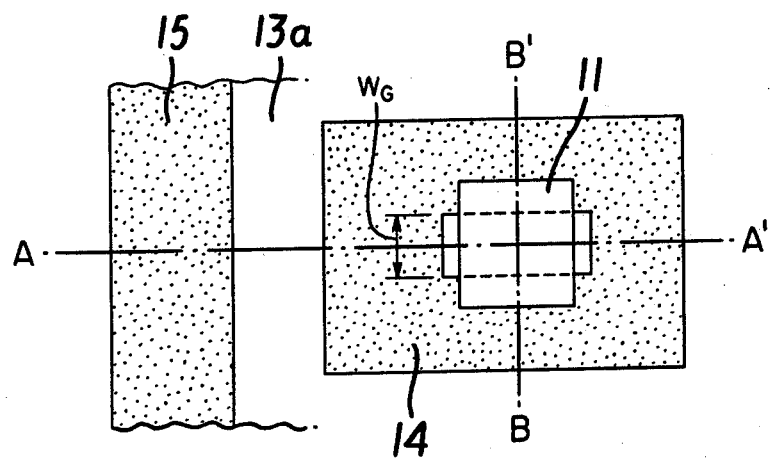
Figure 1C:
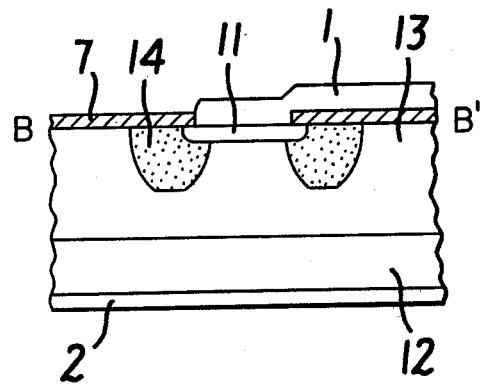
Figure 2A:
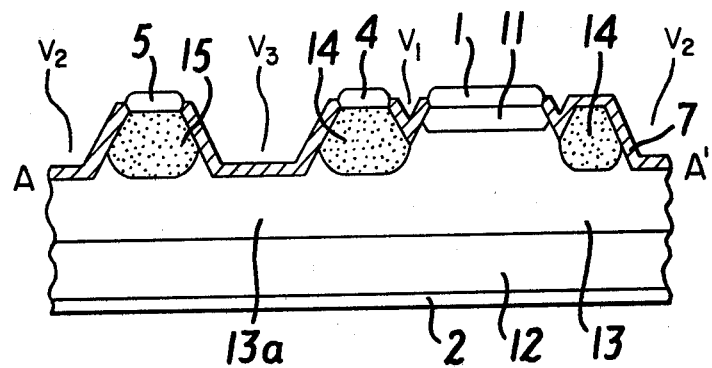
FIGS. 2a to 2c illustrate an embodiment of the planar-gate type SITL structure in accordance with the present invention.
Figure 2B:
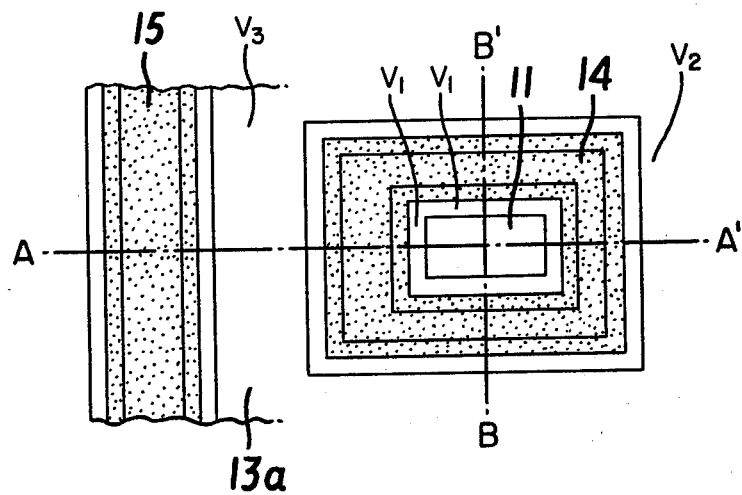
Figure 2C:
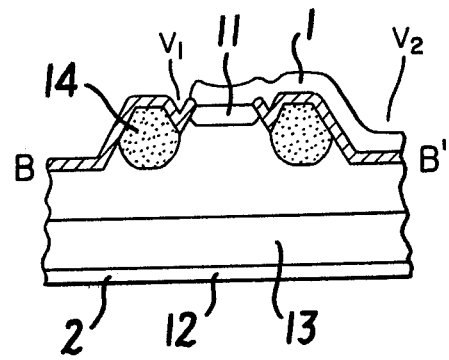

FIG. 2 illustrates an SIT structure in accordance with the present invention, and the embodiment is an example in which the present invention is applied to the same circuit form as that of FIG. 1. FIG. 2b is a plan view and FIGS. 2a and 2b are sectional view taken on lines A—A' and B—B' in FIG. 2b, respectively. A $n^+$ drain region 11, a $p^+$ gate region 14 and a $p^+$ emitter region 15 appear on the same surface, and a first concave portion $V_1$ is formed between the $n^+$ drain region 11 and the $p^+$ gate region 14 to avoid or reduce the overlapping between the high impurity density regions. Preferably, the depth of the first concave portion $V_1$ is deeper than that of the $n^+$ region 11 and is shallower than that of the $p^+$ gate region 14, and an off-current can be reduced due to the increase of a control efficiency of a drain current by the $p^+$ gate region 14 and a long distance between the $n^+$ drain region 11 and a potential barrier for electrons in the $n^-$ channel region 13. In view of the static characteristics, there exits the same advantage as that of a step cut type SIT having a step depth equal to that of the first concave portion $V_1$. A second concave portion $V_2$ is formed on an outer surface of the $p^+$ gate region 14 so that a junction area between the $p^+$ gate region 14 and the $n^-$ region 13 is reduced, and the increase of capacitance due to a minority carrier storage effect can be depressed since the injection of holes from the outer surface of the $p^+$ gate region 14 is stopped. As clearly understood from the above description, the depth of the second concave portion $V_2$ is preferably deeper than that of the $p^+$ gate region 14.

In the example shown in FIG. 2, although a third concave portion $V_3$ is also formed in the $n^-$ base region 13a to the same depth as that of the second concave portion $V_2$, since the substantial base width can be enlarged, the increase of an integration density is promoted and a BJT characteristics with less base resistance can be obtained. Furthermore, isolation among elements can be easily carried out due to the formation of the second concave portion $V_2$, and there are advantages in that the necessary width can be reduced. As described hereinafter, the formation of the second concave portion $V_2$ which reaches the $n^+$ source region 12 is also effective.

The structure of the present invention shown in FIG. 2 can be fabricated by the use of usual techniques of oxidation, photo-lithography, etching, diffusion or the like, however, the most suitable method for producing the structure of the present invention will be described in conjunction with FIG. 3. FIGS. 3a to 3e illustrate sectional views of structure obtained at different steps of the manufacture method of the present invention.

Figure 3A:
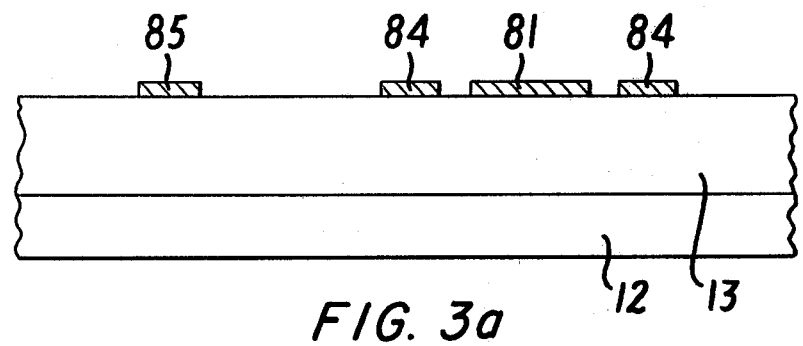
FIGS. 3a to 3e are sectional views illustrating the steps for producing the structure shown in FIG. 2 in accordance with the present invention.

FIG. 3a is a sectional view in which $Si_3N_4$ film is deposited after the $n^-$ region 13 is formed on the $n^+$ Si substrate or the $n^+$ source region 12 of an $n^+$ buried layer by an epitaxial growth technique, and $Si_3N_4$ film regions 81, 84 and 85 are left as a masking at the portions on which the $n^+$ drain region 11, the $p^+$ gate region 14 and the $p^+$ emitter region 15 will be formed in later steps. The impurity density and the thickness of the $n^-$ region 13 depends upon the desired characteristics of the SIT, and they are typically within the range of about $10^{12}$ to $10^{15}$ cm$^{-3}$ and 1 to about 20 μm, respectively. $Si_3N_4$ film can be deposited by a sputtering or a conventional CVD method and a thickness between about 500 and about 2000 Å can be obtained. For removing a distortion due to the film, it is useful to form an $SiO_2$ film of 500 to 1000 Å on the surface of the $n^-$ region 13 as a buffer layer. The $Si_3N_4$ film and the buffer layer of oxide form a masking film. A $SiO_xN_y$ film including oxygen can be also used instead of $Si_3N_4$ film and any materials which can be used as a mask for a Si selective etching or a selective oxidation in a later step, can be used. A selective etching of $Si_3N_4$ film can be performed by a plasma etching, sputter etching, phosphoric acid by using a resist or an oxide film as a mask, however, in this step, each width and location of the p+ gate region 14, the n+ drain region 11 and the p+ emitter region 15 can be determined and this can be carried out on the same plane.

Figure 3B:
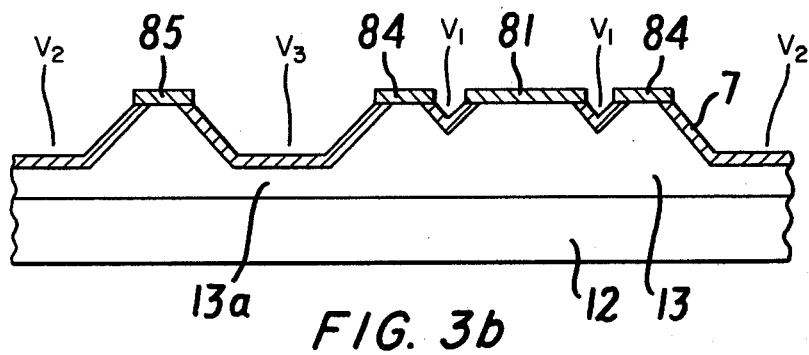

FIG. 3b is a sectional view of the structure, wherein one portion of the n− region 13 is etched by using $Si_3N_4$ films 81, 84 and 85 as a mask to form the first concave portion $V_1$, the second concave portion $V_2$ and the third concave portion $V_3$, and the selective oxide film 7 is formed. Although a selective etching of Si can be performed by a plasma etching using $CF_4$, sputter etching, HF—$HNO_3$ mixture or the like, preferably, a {100} surface is selected for the surface of n− region 13 and each boundary face should be parallel to a direction <110>. That is, since a {111} surface which has low etching speed appears on the side face of the concave portion, by carrying out an anisotropic etching such as a plasma etching using aqueous alkali such as APW, KOH, NaOH or the like, $CCl_4$ trichloroethylene gas, a maximum etching depth depends almost entirely on a mask opening width for selective etching. As the opening width of the first concave portion $V_1$ is typically 0.5 to 4 [μm], a depth of 0.35 to 2.8 [μm] can be obtained under a sufficiently long etching time. Since the opening width of the second concave portion $V_2$ is sufficiently wide, the depth is determined by the etching time. In this example, the depth of the third concave portion $V_3$ is the same as that of the second concave portion $V_2$, however, the depth can be determined in accordance with an opening width as described hereinafter.

Figure 3C:
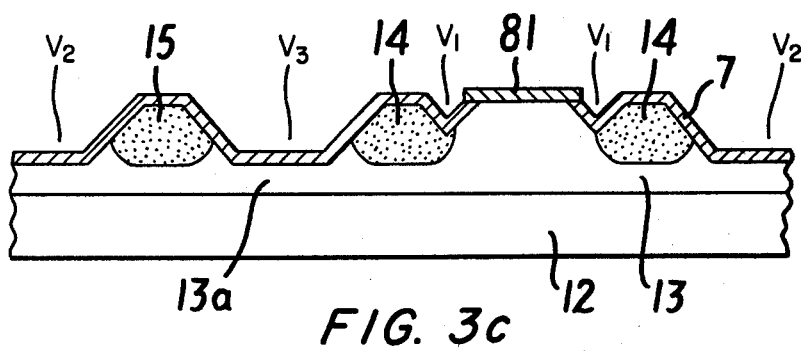

FIG. 3c is a sectional view, wherein $Si_3N_4$ films 84 and 85 are removed by a rough masking step, an opening for p+ diffusion is formed, and the oxidation and the formation of the p+ gate region 14 and the p+ emitter region 15 emitter by p+ selective diffusion are carried out. Preferably, the depth of the p+ diffusion is deeper than that of the first concave portion $V_1$ as described above, and is shallower than that of the second concave portion $V_2$.

Figure 3D:
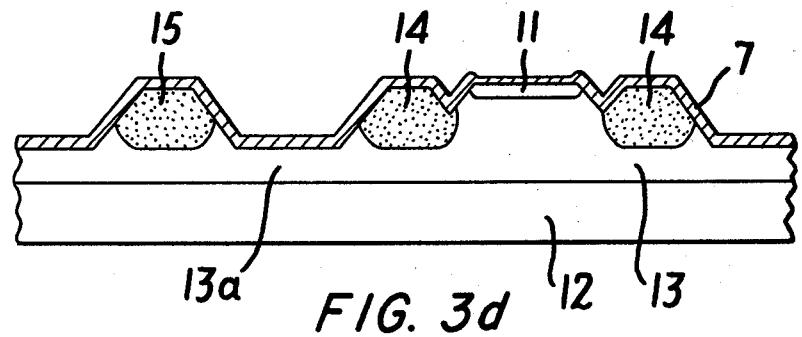
Figure 3E:
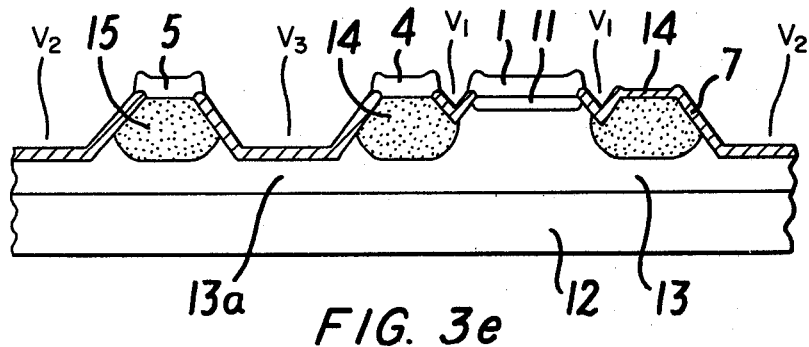

FIG. 3d is a sectional view of the structure, wherein $Si_3N_4$ film 81 is removed by whole etching, or by selective etching and the n+ drain region 11 is formed by a n+ diffusion. Although a doped polycrystal can be used for a n+ diffusion, in any case, it is preferable to form the oxide film 7 on the surface of the diffusion layer is such a way that the thickness of the oxide film 7 is not too thick, the convenience of the formation of contact openings. After this, the contact opening is formed at a predetermined portion of the oxide film 7 as shown in FIG. 3e, and wiring is carried out by evaporating or sputtering the metal (Al, Al-Si, Pt or the like).

Figure 4A:
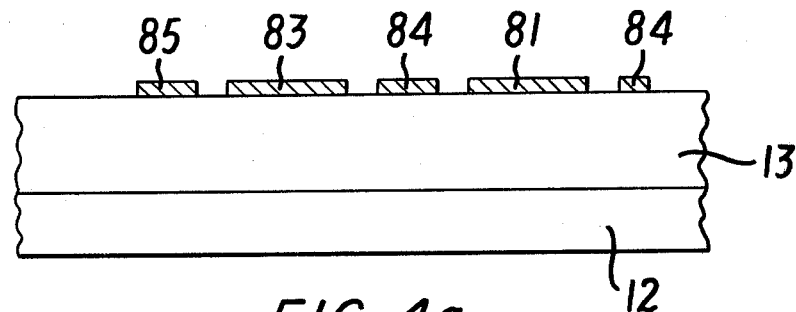
FIG. 4a to FIG. 4e are sectional views illustrating another sequence of steps for producing the structure in accordance with the present invention.
Figure 4B:
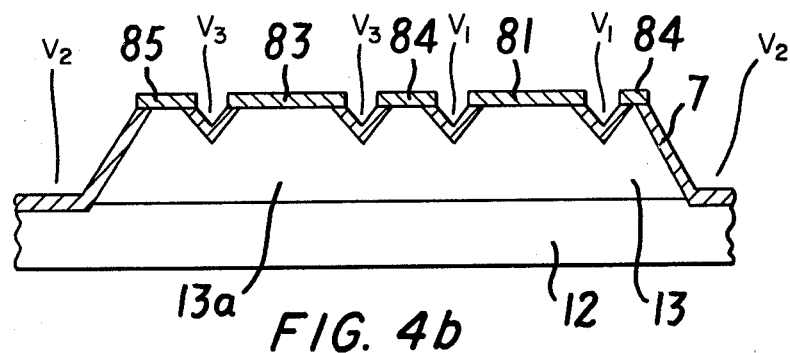
Figure 4C:
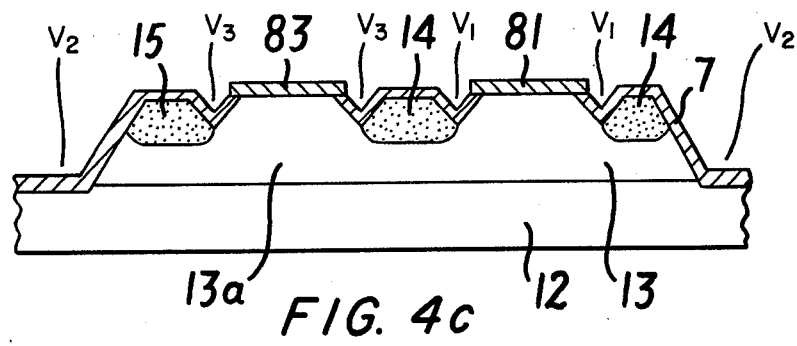
Figure 4D:
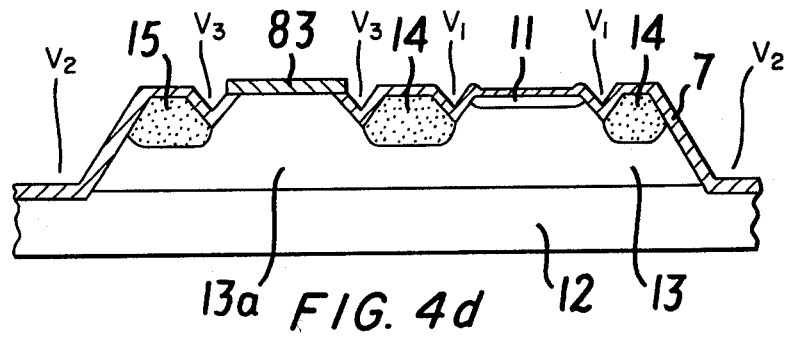
Figure 4E:
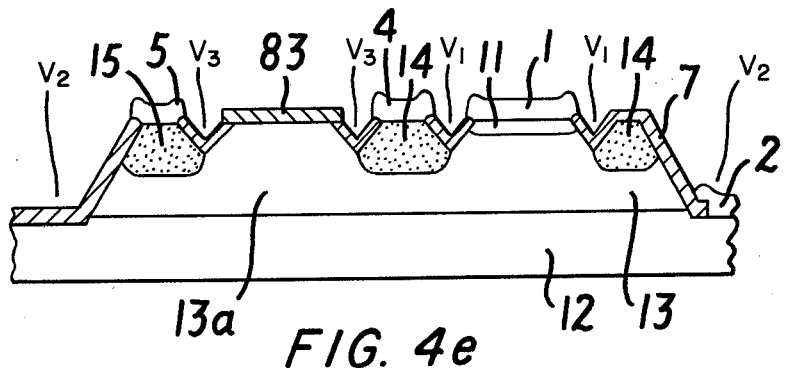

FIGS. 4a to 4e illustrate another manufacturing method of the present invention and sectional views of the resulting structure. FIG. 4a is a sectional view of the structure, showing an $Si_3N_4$ film as a masking film deposited on the surface of the n− region 13 on the n+ source region 12 of {100} surface which is selectively etched, and islands of $Si_3N_4$ films 81, 84, 85 and 83 are left on the regions which should become the n+ drain region 11, the p+ gate region 14, the p+ emitter region 15 and the n− base region 13a, respectively. The opening width of each island-like $Si_3N_4$ film is selected so as to correspond to the depth of each concave portion formed in the next step. FIG. 4b is a sectional view of the structure, wherein the first concave portions $V_1$, the second concave portions $V_2$, and the third concave portions $V_3$ are formed between the gate and the base and between the injector and the base at the same time as in the example of FIG. 3. And then, the selective oxide film 7 is formed. In this example, the second concave portion $V_2$ is formed so as to reach the n+ source region 12. With this structure, the source electrode 2 can be derived from the same surface and the portion $V_2$ can be used as an isolating portion for each element. Preferably, the third concave portions $V_3$ is formed shallow so as to leave the n− base region 13a, and is formed so as to be shallower than the p+ gate region 14. FIG. 4c is a sectional view of the structure, wherein $Si_3N_4$ films 84 and 85 at which p+ gate region 14 and p+ emitter region 15 are formed are removed by a rough masking step and then a p+ diffusion and an oxidation are carried out. FIG. 4d shows steps of removing the $Si_3N_4$ film 81 by a rough masking step and forming the n+ drain region 11, and then the device is completed after the formation of contact openings and metal wiring as illustrated in FIG. 4e.

FIG. 5 illustrates a sectional view of another structure of the present invention, wherein a n+ base region 16 is formed on the surface of the n− base region 13 to reduce surface recombination and improve the device characteristics. As described in conjunction with FIG. 4d, it can be realized if the $Si_3N_4$ film 83 is removed together with the $Si_3N_4$ film 81 on the n+ drain region 11 at the formation of the opening for n+ diffusion. This method is also applicable for producing a lateral SIT or a lateral FET if a p type region is used instead of the n− base region 13a and it has the effect of reducing the capacitance and improving the voltage resistance.

FIGS. 6a to 6g are partialy enlarged sectional views to aid in understanding another production method of the present invention. Although the n+ source region 12 and the p+ emitter region 15 are omitted therefrom, the positioning and manufacturing steps are the same as that of the foregoing example. FIG. 6a is a sectional view of the structure, wherein the n− region comprises a n− single crystal layer 13, a n type low impurity density polycrystal layer and $Si_3N_4$ film is deposited as a masking film, $Si_3N_4$ films 81 and 84 are left for the portions which becomes the n+ drain region 11 and the p+ gate region 14 in a later step, and polycrystal layers 91 and 94 are left in a similar way as the way described above. Of course, oxide film can be held as one of the masking films in the boundary portion of the polycrystal layer and $Si_3N_4$ film.

FIG. 6b is a sectional view, wherein oxide films 7 are formed on the side faces of the polycrystal layers 91 and 94 and on the exposed face of the n− single crystal layer 13 by a selective oxidation. Since the thicker oxide film 7 can be formed on the side surfaces of the polycrystal layers 91 and 94 than that of the single crystal layer 13, it is possible to leave the oxide films 7 only on the side face of the polycrystal layers 91 and 94 by effecting whole etching of the oxide film 7, as shown in FIG. 6c. Although $Si_3N_4$ films 81, 84 and the oxide film 7 are used as masks for an anisotropic etching in the next step, the above mentioned steps are suitable for polycrystal layers 91 and 94 having a width less than two times the depth of the second concave portion $V_2$ and it is not always necessary for selective oxidation when the width is more than that. FIG. 6d is a sectional view, wherein a selective oxidation is carried out again after the formation of the first concave portion $V_1$ and the second concave portion $V_2$ by an anisotropic etching. Next, it follows that the p+ gate region 14 is formed through the window by removing an insulator film of the masking film, i.e., the $Si_3N_4$ film 84, as in the example described above. However, in this embodiment, as illustrated in FIG. 6e, as well as Si$_3$N$_4$ film 81, Si$_3$N$_4$ film 84c on a region at which a gate contact portion should be formed in later step is left, a p+ selective diffusion is carried out to form the p+ gate region 14. At this time, since an oxidation is also carried out, the polycrystal layer 94 which is not masked by Si$_3$N$_4$ film 84c becomes a p+ polycrystal and is almost changed into thick oxide film 7. However, the polycrystal layer 94 under the Si$_3$N$_4$ film 84c is left as a p+ polycrystal due to the high speed diffusion in the lateral direction. Moreover, as shown FIG. 6b, only the Si$_3$N$_4$ film 81 is removed in the mask step, and the n+ drain region 11 and the n+ polycrystal layer 91 are formed by diffusion. The gate contact is formed by whole etching the Si$_3$N$_4$ film 84c and metal wirings are made to obtain the structure shown in FIG. 6g. At this time, if a p type impurity or a metal involving a p type impurity is alloyed to the gate contact portion, a preferable ohmic contact is obtained. It is applicable to the drain contact, however, a detailed description is omitted. With this step, the contact can be done by a self-alignment technique and a thicker oxide film 7 on the p+ gate region 14 can be obtained to reduce capacitance. Moreover, a short or a low voltage resistance between the gate and the drain due to a metal spike phenomenon can be prevented in cooperation with the existance of the first concave portion $V_1$. In FIGS. 7a to 7j, one example of the manufacturing method of the present invention for fabricating the SITL having the structure shown in FIG. 2 is illustrated.

Figure 7B:
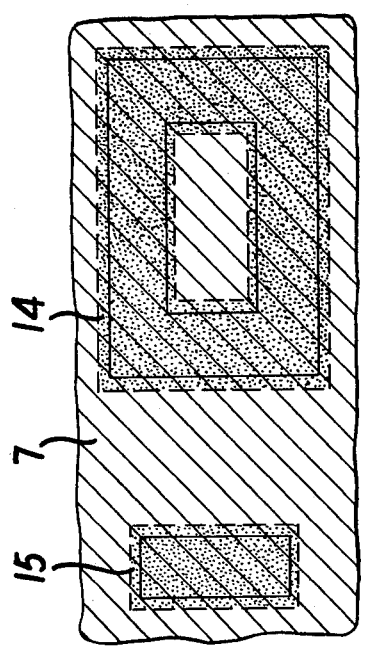
Figure 7D:
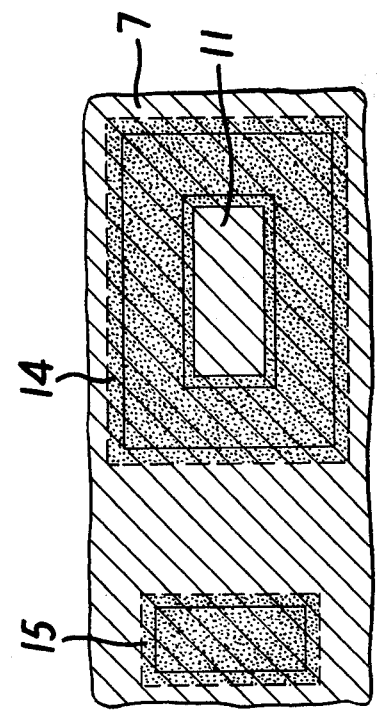
Figure 7A:
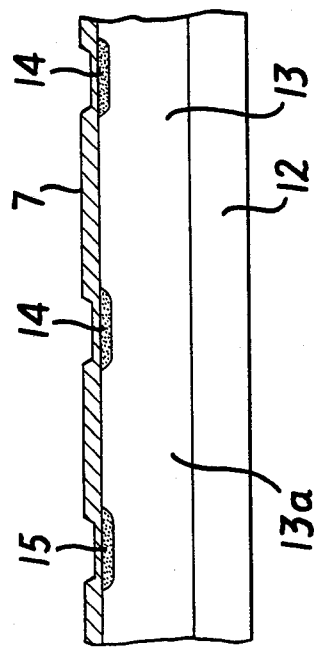

A sectional view and a plane view of the device, wherein a p+ gate region 14 and a p+ injector region 15 are formed as shallow diffusion regions by using a oxide film 7 on the n$^-$ region 13 as a diffusion mask, are illustrated in FIGS. 7a and 7b. Since the depth of p+ diffusion is adjusted so as to be a desired value in a later step, it is sufficient to carry out the diffusion only in the vicinity of the surface. The plane configuration of the diffusion region is changed in the later Si etching step so as to have desired dimensions, the width may be wider than the desired width. Moreover, the thickness of the oxide film 7 formed on the diffusion region determines the thickness of the mask for n+ diffusion in the next step so that the thickness of the oxide film 7 is required to be thin, such as from 1000 to 2000 [Å].

Figure 7C:
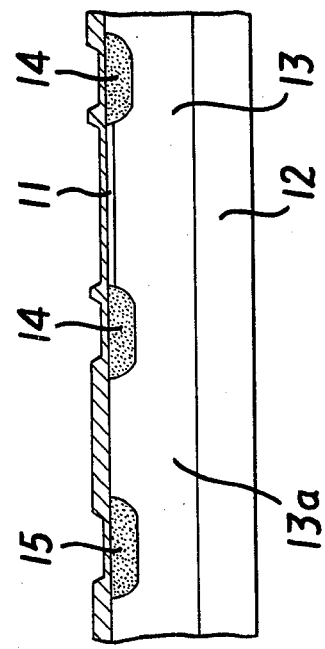

FIGS. 7c and 7d illustrate a sectional view and a plane view of a n+ diffusion region which is formed when the n+ drain region 11 is formed. As with the case of the formation of the p+ diffusion region, the size of the region formed by the n+ selective diffusion is larger and the depth of the region is shallower. The oxide film on the n+ diffusion region may be omitted. That is, since the function of the oxide film is to act as a buffer film for the deposition of the Si$_3$N$_4$ film in the next step, it is sufficient to be 0 to 100 [Å] thick. The surface impurity density of the n+ diffusion may be more or less than that of the p+ diffusion, however, it is not necessary to carry out the selective diffusion when the density of the n+ diffusion is less than that of the p+ diffusion. Therefore, the diffusion may be carried out over the entire surface. The precise size of the mask opening for the p+ and the n+ diffusion steps is not required.

In FIGS. 7e and 7f, an insulation film which is different from the mask for a selective oxidation, such as Si$_3$N$_4$ film, is deposited and these insulation films 84, 81 and 85 are left on the gate region 14, the drain region 11 and the injector region 15 with a predetermined plane size. Moreover, the oxidation film 7 under these regions is also left and other portions of the film 7 are removed. In this figure, although the Si$_3$N$_4$ film 83 is also left on the n$^-$ base region (n$^-$ region 13) of the lateral pnp BJT, the film 83 is not necessary for the final structure just as with the lateral pnp BJT shown in FIG. 2.

FIGS. 7g and 7h are a sectional view and a plane view of the structure, wherein a Si selective etching using the mask of Si$_3$N$_4$ films 81, 83, 84 and 85 is carried out to form the first concave portion $V_1$ with a shallow depth, the second concave portion $V_2$ with a deep depth and the third concave portion $V_3$ with a shallow depth, and then Si$_3$N$_4$ films 81, 84 and 85 are removed so as to leave the portion which corresponds to the portion to be used for a contact opening.

Figure 7I:
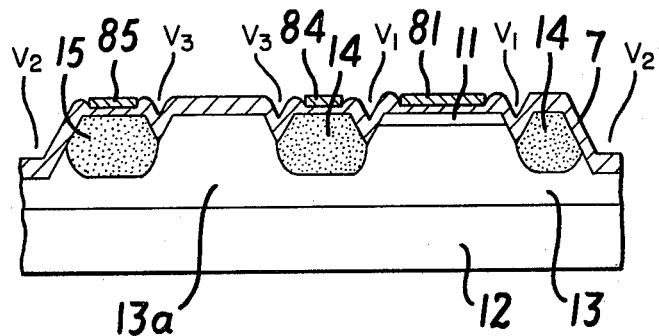
Figure 7J:
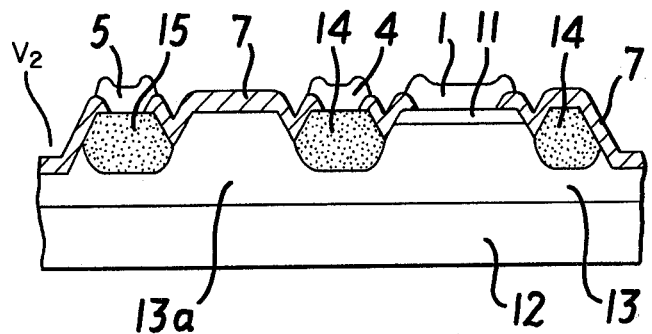

As described above, anistropic etching is mainly used for selective etching of silicon. In this method, since the etching speed for the p+ region is also slow, at first, the high density portion may be removed by another etching technique. The size of each region in a plane is finally determined by the anisotropic etching step, and the relative positioning error in each region depends upon only the accuracy of the mask size. Then, Si$_3$N$_4$ films 81, 84 and 85 are left on each portion of the n+ drain region 11, the p+ gate region 14 and p+ injector region 15 to which a contact opening is formed. As a result, the positional shift among the contact openings and each region can be perfectly avoided. FIG. 7i illustrates a sectional view, wherein each diffusion depth spreads to a desired depth by carrying out a selective oxidation by the use of masks of Si$_3$N$_4$ films 81, 84 and 85. Since the depth of the p+ gate region 14 should be larger than that of the n+ drain region, a diffusion coefficient for the p type impurity is selected so as to be larger than that of the n type impurity. For example, B and As are used, respectively. FIG. 7j is a sectional view, wherein Si$_3$N$_4$ films 81, 84 and 85 are removed, Si is exposed by etching the oxidation film 7 to obtain contact openings, and then the evaporation of metal (Al, Pt, Al-Si and so on) is carried out to form wiring.

As described above, according to the present invention, openings used for each selective diffusion step are not required to be precisely formed, an impurity with a small diffusion coefficient is added to the portion at which a final diffusion depth should be shallow and an impurity with a large diffusion coefficient is added to the portion at which a final diffusion depth should be deep. In the n channel SIT shown in FIG. 7, the p+ gate region is formed by the addition of B, Al, Gs, etc., and the n+ drain region is formed by the addition of As, Sb, etc. In the P channel type, conversely, In, Tl, B, etc. are added to the p+ drain region, and P is added to the n+ gate region. Of course, controlling the final value for the region to which deeper diffusion is desired is possible by carrying out a selective diffusion in advance.

Figure 8A:
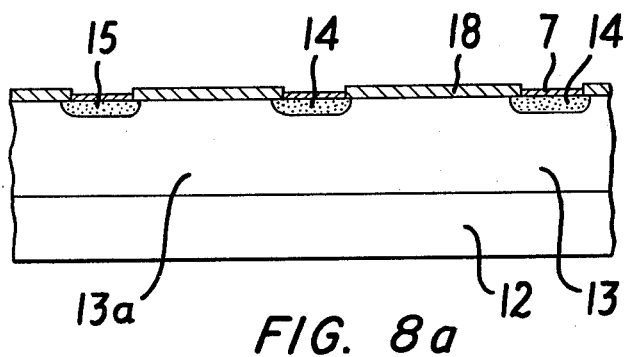
FIGS. 8a and 8b are sectional views illustrating another method of the present invention.
Figure 8B:
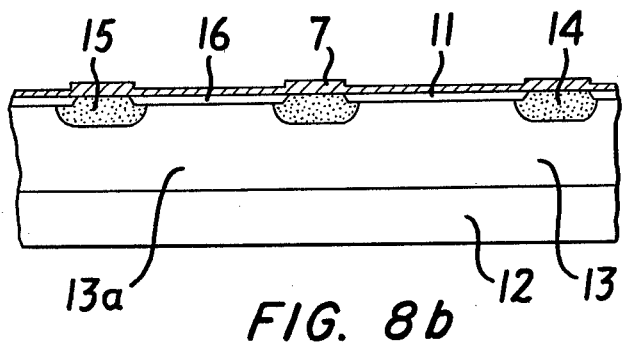

FIG. 8 shows the sectional view of the process for illustrating another manufacturing method according to the present invention. Referring to FIG. 8a, the n$^-$ region 13 is formed on the n+ source region 12 by an epitaxial growth technique, an insulation film 18 of Si$_3$N$_4$ or the like is deposited thereon, and the p+ gate region 14 and the p+ injector region 15 are formed by a shallow diffusion. The oxide film 7 is formed in the p+ diffusion region. Referring to FIG. 8b, Si$_3$N$_4$ film 18 is removed by a whole-surface etching, and the n+ diffusion layer is formed on the whole surface except for the p+ diffusion region. This n+ diffusion layer includes regions to be formed as the n+ drain region 11 and the n+ base region 16. The thickness of the oxide film 7 formed on each diffusion layer is preferably thin.

After Si$_3$N$_4$ film is deposited, in accordance with the plane shape and size of each region, Si$_3$N$_4$ film and SiO$_2$ film are left and each concave portion is formed by anisotropic etching as in the process shown in FIG. 7.

This method has an advantage that the number of steps which require a mask is greatly reduced.

Figure 9A:
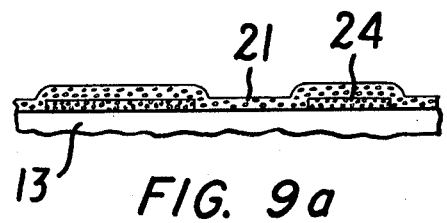
Figure 9B:
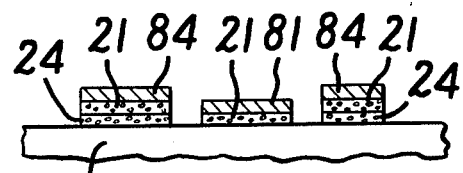

The first shallow p diffusion layer and the first shallow n diffusion layer can be formed by each of the following techniques normal gas diffusion, solid source diffusion, spin coat diffusion source and a doped oxide method, however, impurity added polycrystal can also be used. In FIG. 9, a method of the present invention using an impurity added polycrystal, so called doped polycrystal, is illustrated. For convenience sake, the sectional view of the portion in the vicinity of the surface of the SIT is illustrated. Referring to FIG. 9a, a P type doped polycrystal layer 24 is deposited and an n type doped polycrystal layer 21 is deposited over the entire surface, after the layer 24 is removed except for the portion to be formed as a gate region. In this case, the diffusion coefficient of each added impurity of p type is larger than that of n type, and n type density is smaller than that of p type. In FIG. 9b, Si$_3$N$_4$ film is deposited on the polycrystal layer 21, and Si$_3$N$_4$ films 81, 85 and the polycrystal layers 21, 24 are left to expose the n− (single crystal) region 13 in such a way that each region has a required plane configuration.

Figure 9C:
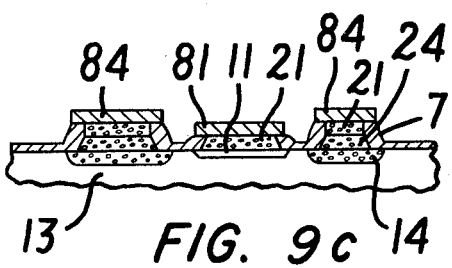

By referring to the process shown in FIGS. 6b, 6c and 6d, the sectional view shown in FIGS. 9c and 9d can be obtained.

In order to avoid the diffusion of unnecessary impurities, it is desirable to utilize high oxidation at low temperature. Next, as illustrated in FIG. 9e, Si$_3$N$_4$ films 81 and 84 on the contact opening portions are left and are diffused as other regions are selectively oxidized. At this time, the polycrystal layers 21 and 24 under the contact opening portions in p+ gate region 14 are changed to P type conductivity due to a high speed diffusion, and thick oxide film 7 is formed to reduce a wiring capacitance because other polycrystal is liable to be oxidized. The following steps may be carried out in a manner similar to the example of FIG. 7. A spike phenomenon in metal can be avoided because the contact is made through the polycrystal layer. It is sufficient for the impurity density of polycrystal layers 21 and 24 to be high to such a degree that an ohmic contact is realized. In this example, density of P type is a $10^{19}$ to $10^{20}$ [cm$^{-3}$] and density of n type is slightly lower value of $5 \times 10^{18}$ to $9 \times 10^{19}$ cm$^{-3}$. These values are sufficient for attaining the ohmic contact. A diffusion using a doped polycrystal as well as a method shown in FIGS. 7 and 8 is also applicable. A selective oxidation for side faces is effective for avoiding side etching.

This method can not only be applied to a doped polysilicon but also to the method of an another diffusion.

Figure 10:
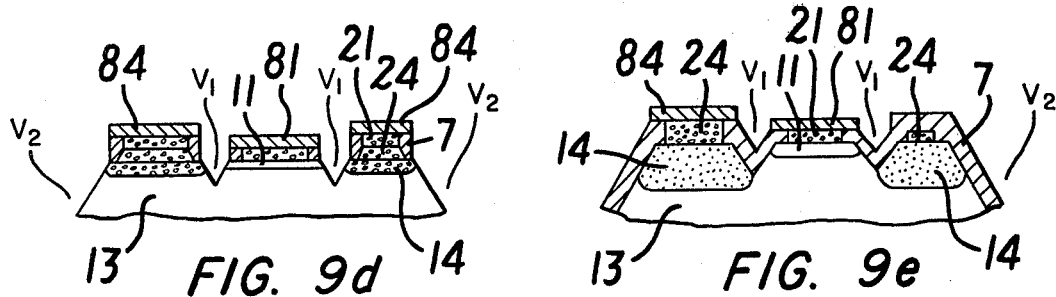
FIG. 10 is a sectional view illustrating an example of another structure of the present invention.
Figure 10:
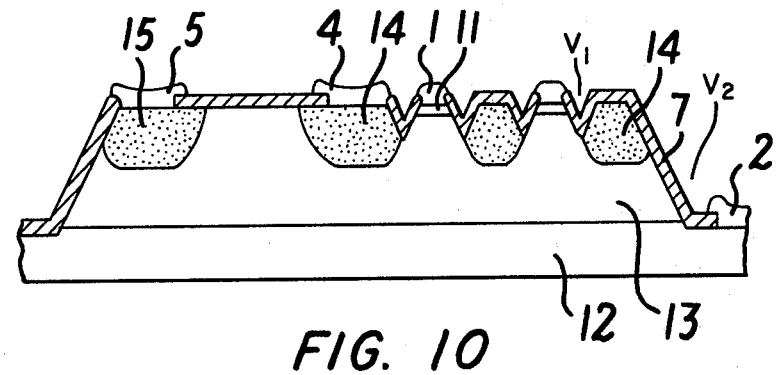

FIG. 10 illustrates other structure in accordance with the present invention, wherein the lateral BJT does not have the third concave portion V$_3$. The manufacturing method thereof is easily understood from the above description so that the description thereof is omitted. This structure has the conventional advantage of obtaining a sufficiently large current.

Figure 11A:
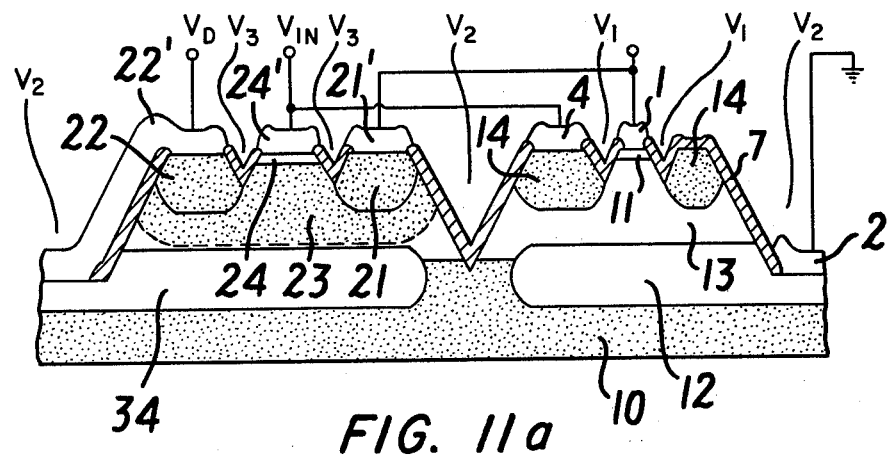
FIG. 11a is a sectional view of the structure of another logic circuit in accordance with the present invention.
Figure 11B:
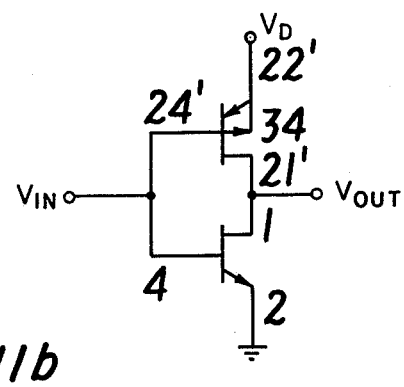
FIG. 11b is an equivalent circuit thereof.

FIG. 11 illustrates an example in which the present invention is applied to another logic circuit, and equivalent circuit thereof is shown in FIG. 11b. This device is called a complementary SITL wherein P channel and N channel SITs are connected in series and input terminals are commonly connected to the gates 24′ and 4 of these SITs. The P channel SIT has a lateral structure, wherein a p+ source region 22, a p+ drain region 21 and a n+ gate region 24 are arranged on the same plane and the P− channel region 23 is formed on a n+ embeded gate region 34. The N channel SIT has the conventional vertical structure. These SITs are isolated by the second concave portion V$_2$ which reaches the p type substrate 10 and the reduction of the capacitance is implemented by the first concave portion V$_1$ and the third concave portion V$_3$. The same method as that described above is also applicable to the device so that description of the manufacturing method will be omitted, and also has the advantage of the exposed regions on the same plane and the effect due to the concave portion.

As described above, according to the present invention, reduction of capacitance between the gate and the drain and improvement of the voltage resistance characteristic can be achieved by the formation of the first concave portion, and the SIT have a fully narrow gate spacing can be realized without making a sacrifice of any characteristics. Moreover, the reduction of a junction capacitance and minority carrier storage effect can be achieved due to the second concave portion V$_2$ and the structure is suitable for a high integration density device.

In the manufacturing method, the fine working can be easily carried out because each high impurity density region is formed on the same surface, and also positional difference among regions can be removed. Of course, the first concave portions V$_1$ are not necessarily formed so as to have the same depth. Moreover, since the improved lateral BJT, SIT or FET can be realized by the same steps, the present invention is particularly useful for the integrated circuit involving a vertical type SIT. The above description is mainly of an inverted type SIT, however, the present invention is also applicable to a vertical type SIT having a source electrode on a major surface, a P channel vertical type SIT, a vertical type FET in which an impurity density of the channel region is high and a negative feed-back resistance is increased, and a normally-on type SIT in which a gate spacing is enlarged or an impurity density of the channel region is increased. The present invention is not applicable only to a logic integrated circuit, but is applicable to an analog integrated circuit, a memory or the like. Device material is not limited to Si, and a compound semiconductor such as Ga, As or the like is also usable and a remarkable effect can be obtained because the compound semiconductors are easily etched by anisotropic etching. As described above, the application scope of the present invention is wide and the present invention has great industrial value.

What is claimed is:

1. A method of manufacturing an integrated circuit device including at least one vertical field effect transistor, comprising the steps of:

forming a first single crystal semiconductor layer of one conductivity type and of a low impurity density on a second single crystal semiconductor layer of one conductivity type and of a high impurity density;

depositing a masking film including a nitride over a whole surface of said first layer;

removing selected portions of said masking film while leaving at least first and second portions thereof intact where said second portion circumscribes said first portion;

forming a first recess between said first and second portions of the masking film and a second recess at least partially outside of said second portion of the masking film in said first layer by use of said masking film at least as a mask for etching said first layer;

selectively oxidizing the exposed surface of said first layer by use of the intact masking film;

forming a second single crystal region of opposite conductivity type to said one conductivity type in said first layer through the window opened by removing an insulator film of said second portion of the masking film; and forming a first single crystal region of one conductivity type and of a high impurity density in said first layer through the window opened by removing an insulator film of said first portion of the masking film;

whereby a transistor is formed by using said first layer, said second layer, said first region and said second region as the channel region, source region, drain region and the gate region, respectively, of the transistor.

2. A method of manufacturing an integrated circuit device including at least one vertical field effect transistor as claimed in claim 1; wherein said masking film is at least composed of a nitride film, and a polycrystal film of high resistivity under said nitride film on said first layer; and selectively oxidizing the exposed side edges of said polycrystal film of said first and second portions and the exposed surface of said first layer and then removing the oxide film on the surface of said first layer before carrying out the steps of forming the first and second recesses.

3. A method of manufacturing an integrated circuit device including at least one vertical field effect transistor as claimed in claim 1; wherein said first layer has a surface of a [100] crystallographic plane, and said first and second recesses are formed at the same time by an anisotropic etching technique which has an etching speed at least as fast as a [111] crystallographic plane as compared with other crystallographic planes.

4. A method of manufacturing an integrated circuit device including at least one vertical field effect transistor as claimed in claim 3; wherein said first recess is formed shallower than said second recess by forming the surface width of said first layer between said first and second portions of the masking film smaller than that between said second portion and other portions of the masking film, and said first region is formed shallower than said first recess and said second region is formed deeper than said first recess.

5. A method of manufacturing an integrated circuit device including at least one vertical field effect transistor as claimed in claim 1; comprising the steps of:

forming said first layer on said second layer;

depositing said masking film on said first layer;

removing selected portions of said masking film while leaving at least said first and second portions and a third portion thereof intact where said third portion is formed spaced from the outside of said second region;

forming said first and second recesses and a third recess between said second and third portions of the masking film in said first layer;

selectively oxidizing the exposed surface of said first layer by use of said intact masking film;

forming said second region and a third region of said opposite conductivity in said first layer thorugh the windows opened by removing an insulator film of said second and third portions of the masking film; and forming said first region;

whereby said transistor and a lateral transistor are formed, the latter of which is composed of said third region as an emitter or an injector, said first layer as a base, said second layer as a base electrode region and said second region as a collector.

6. A method of manufacturing an integrated circuit device including at least one vertical field effect transistor as claimed in claim 5; wherein a fourth portion of said masking film is left when leaving said first, second and third portions of masking film, the fourth portion being localized between said second and third portions, and said third recess being formed in said first layer between said second and fourth portions of the masking film and a fourth recess being formed between said third and fourth portions of the masking film in said first layer.

* * * * *